(12) United States Patent
Wang et al.

(10) Patent No.: US 12,016,122 B2
(45) Date of Patent: Jun. 18, 2024

(54) VIDEO TRANSCODING CARD WITH TWO TRANSCODING ASSEMBLIES STACKED ON ONE ANOTHER

(71) Applicants: Inventec (Pudong) Technology Corporation, Shanghai (CN); INVENTEC CORPORATION, Taipei (TW)

(72) Inventors: Xun Wang, Shanghai (CN); Sheng Guo, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 285 days.

(21) Appl. No.: 17/693,498

(22) Filed: Mar. 14, 2022

(65) Prior Publication Data

US 2022/0400551 A1 Dec. 15, 2022

(30) Foreign Application Priority Data

Jun. 11, 2021 (CN) .......................... 202110653814.5

(51) Int. Cl.
*H05K 1/14* (2006.01)
*H05K 1/11* (2006.01)
*H05K 5/03* (2006.01)

(52) U.S. Cl.
CPC ................. *H05K 1/14* (2013.01); *H05K 1/11* (2013.01); *H05K 5/03* (2013.01); *H05K 2201/04* (2013.01); *H05K 2201/10409* (2013.01)

(58) Field of Classification Search
CPC .......... H05K 1/144; H05K 7/142; H05K 1/14; H05K 1/141; H05K 2201/10409; H05K 5/03; H05K 1/11; H05K 2201/2036
See application file for complete search history.

(56) References Cited

U.S. PATENT DOCUMENTS

| 6,249,442 B1* | 6/2001 | Watanabe | H05K 7/142 361/752 |
| 6,864,569 B2* | 3/2005 | Evans | H05K 1/144 257/723 |

(Continued)

FOREIGN PATENT DOCUMENTS

CN 110311793 A * 10/2019 ........... H01L 23/367

*Primary Examiner* — James Wu
(74) *Attorney, Agent, or Firm* — Locke Lord LLP; Tim Tingkang Xia, Esq.

(57) ABSTRACT

A video transcoding card includes a first transcoding assembly and a second transcoding assembly. The first transcoding assembly includes a first circuit board, first transcoding boards, and a first main electrical connector. The first transcoding boards and the first main electrical connector are disposed on the first circuit board and are electrically connected to the first circuit board. The second transcoding assembly includes a second circuit board, second transcoding boards and a second main electrical connector. The second transcoding boards and the second main electrical connector are disposed on the second circuit board and are electrically connected to the second circuit board. The first main electrical connector and the second main electrical connector are connected to each other, and the second transcoding boards are electrically connected to the first circuit board via the second circuit board, the second main electrical connector, and the first main electrical connector.

9 Claims, 5 Drawing Sheets

(56) References Cited

U.S. PATENT DOCUMENTS

| | | | | |
|---|---|---|---|---|
| 7,451,410 B2* | 11/2008 | McCubbrey | ............ | G06F 30/34 |
| | | | | 716/137 |
| 2014/0198471 A1* | 7/2014 | Kajio | ................. | H05K 7/142 |
| | | | | 361/804 |
| 2020/0412042 A1* | 12/2020 | Zhao | ................. | H01R 12/722 |

* cited by examiner

VIDEO TRANSCODING CARD WITH TWO TRANSCODING ASSEMBLIES STACKED ON ONE ANOTHER

CROSS-REFERENCE TO RELATED APPLICATIONS

This non-provisional application claims priority under 35 U.S.C. § 119(a) on Patent Application No(s). 202110653814.5 filed in China on Jun. 11, 2021, the entire contents of which are hereby incorporated by reference.

Technical Field of the Invention

The invention relates an expansion card, more particularly to a video transcoding card.

Description of the Related Art

As technology develops and progresses, a server is widely used in a variety of fields. In order to meet different requirements, a user can selectively add one or more expansion card into the server to increase its performance.

There are various kinds of expansion cards, such as transcoding card, internet card, sound card and so on. Regarding to the transcoding card, the transcoding card can convert original video stream to another stream of different encoding formats, resolutions, or data rates to meet the requirement of different internet environment, terminal, or scenario.

In general, there are many transcoding boards on a single transcoding card, and the server may be equipped with many transcoding cards to increase the amount of the transcoding boards for increasing the performance of the video transcoding. However, the amount of the transcoding boards that the server can accommodate at most is limited by its interior space, and thus it is difficult to further increase the amount of transcoding boards for increasing the performance of the video transcoding. Therefore, how to solve the aforementioned problems is one of crucial topics in this field.

SUMMARY OF THE INVENTION

The invention is to provide a video transcoding card which is capable of increase the performance of the video transcoding.

One embodiment of the invention provides a video transcoding card. The video transcoding card includes a first transcoding assembly and a second transcoding assembly. The first transcoding assembly includes a first circuit board, a plurality of first transcoding boards, and at least one first main electrical connector. The first transcoding boards and the first main electrical connector are disposed on the first circuit board and are electrically connected to the first circuit board. The second transcoding assembly includes a second circuit board, a plurality of second transcoding boards and at least one second main electrical connector. The second transcoding boards and the second main electrical connector are disposed on the second circuit board and are electrically connected to the second circuit board. The first main electrical connector and the second main electrical connector are connected to each other so as to hold the second circuit board to be located above the first circuit board, and the second transcoding boards are electrically connected to the first circuit board via the second circuit board, the second main electrical connector, and the first main electrical connector.

According to the video transcoding card discussed in the above embodiment, there are many first transcoding boards disposed on the first circuit board and many second transcoding boards disposed on the second circuit board, and the second transcoding boards on the second circuit board are electrically connected to the first circuit board via the second circuit board, the second main electrical connector, and the first main electrical connector. Thus, the first circuit board can serve as the main board of the video transcoding card; that is, the second transcoding boards on the second circuit board and the first transcoding boards on the first circuit board can share the electronic components on the first circuit board. As such, the arrangement of the electronic components on the second circuit board can be omitted, such that the space on the second circuit board can accommodate the second transcoding boards as many as possible to make the total amount of the transcoding boards of the video transcoding card greater than the total amount of the transcoding boards of two conventional transcoding cards. Therefore, assuming that the video transcoding card and the two conventional transcoding cards substantially occupy the same size of the space in a server, adopting the video transcoding card can increase the performance of the video transcoding.

BRIEF DESCRIPTION OF THE DRAWINGS

The present invention will become better understood from the detailed description given herein below and the accompanying drawings which are given by way of illustration only and thus are not intending to limit the present invention and wherein.

DETAILED DESCRIPTION

Figure 1:
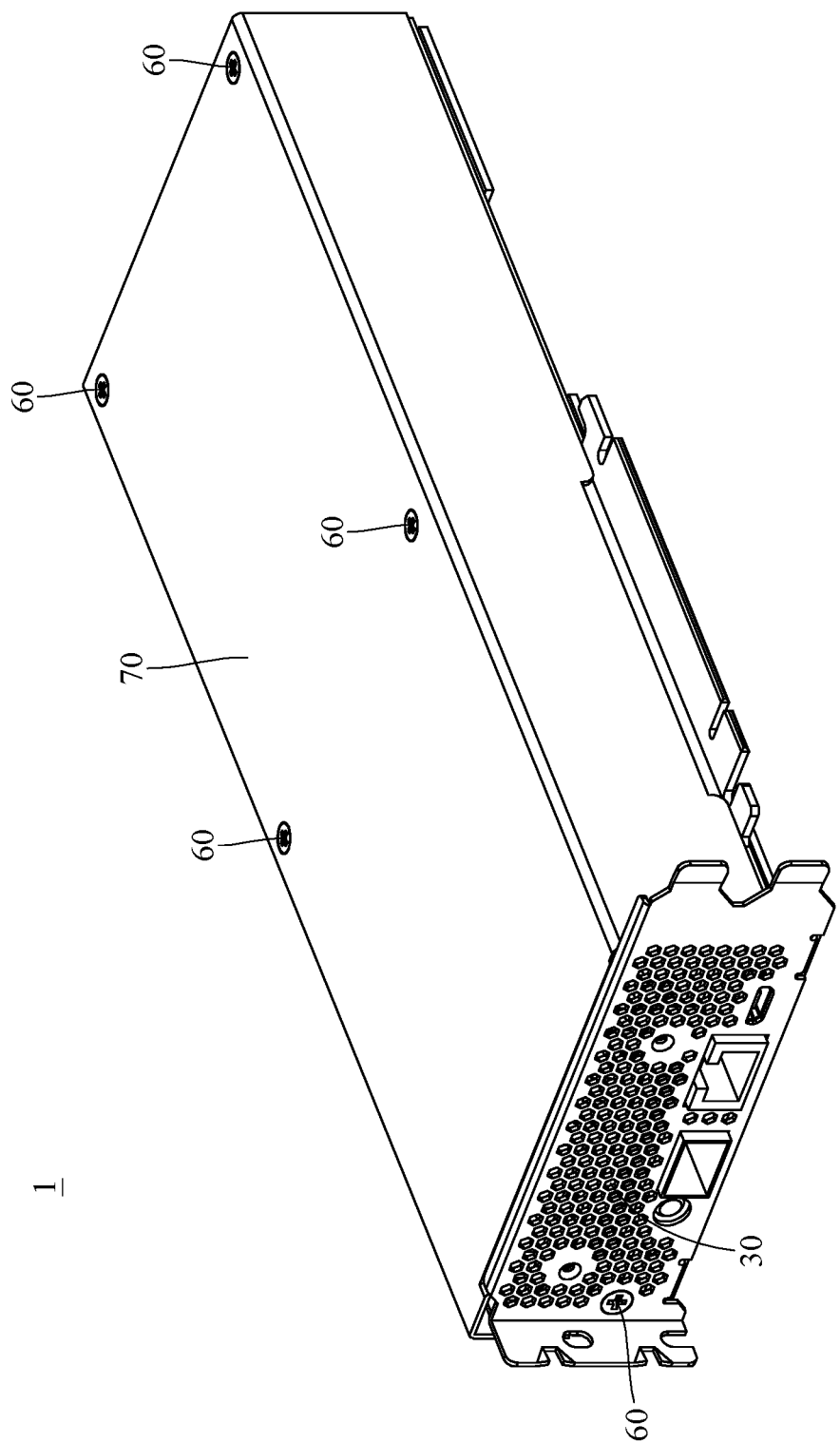
FIG. 1 is a perspective view of a video transcoding card according to one embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the following embodiments are disclosed by the figures, and some practical details are described in the following paragraphs, but the present invention is not limited thereto. Furthermore, for the purpose of illustration, some of the structures and components in the figures are simplified, and wires, reference lines or buses are omitted in some of the figures.

Moreover, the terms used in the present invention, such as technical and scientific terms, have its own meanings and can be comprehended by those skilled in the art, unless the terms are additionally defined in the present invention. That is, the terms used in the following paragraphs should be read on the meaning commonly used in the related fields and will not be overly explained, unless the terms have a specific meaning in the present invention.

Figure 2:
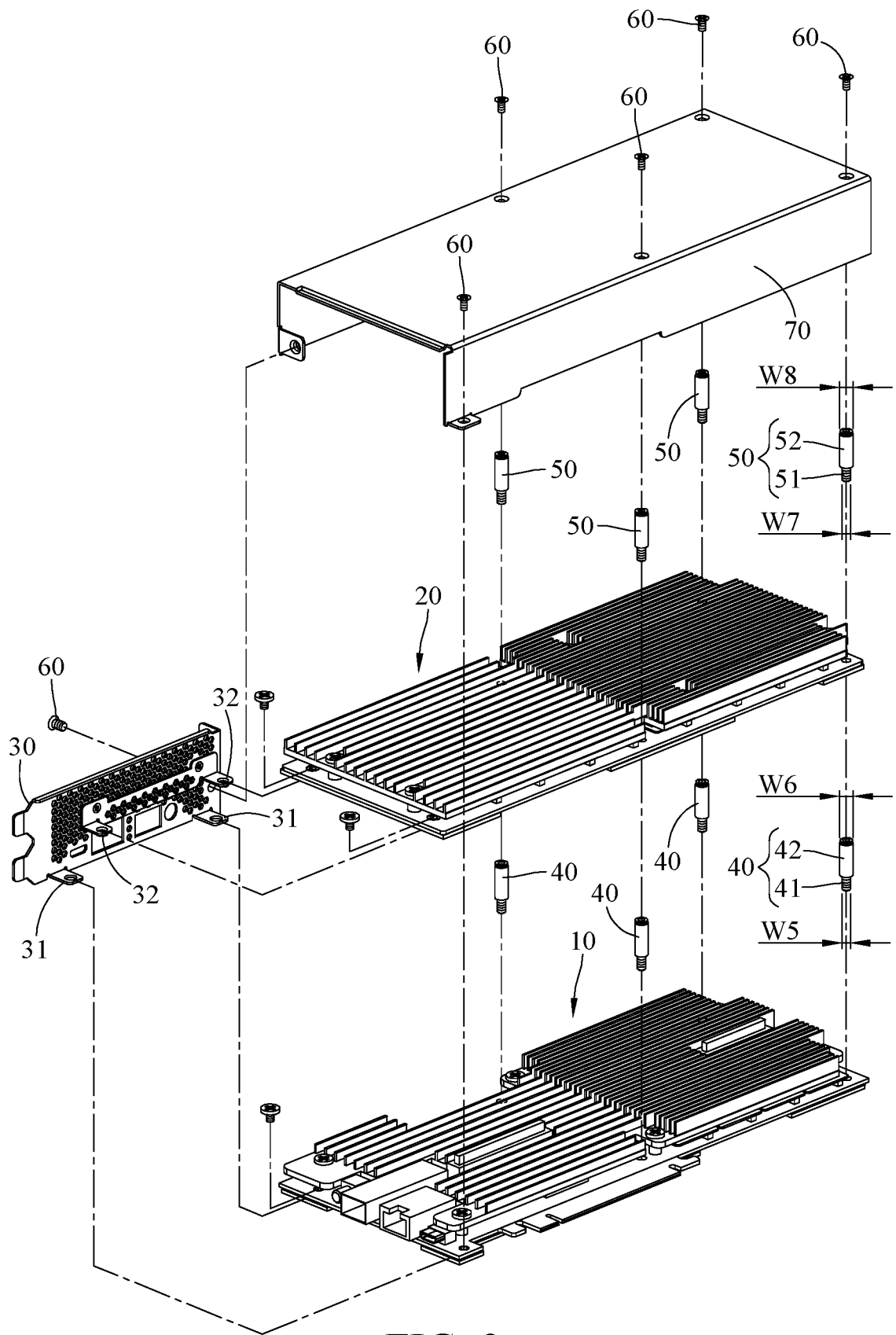
FIG. 2 is an exploded view of the video transcoding card in FIG. 1.

Referring to FIGS. 1 and 2, there are shown a perspective view of a video transcoding card 1 according to one embodiment of the invention and an exploded view of the video transcoding card 1 in FIG. 1.

In this embodiment, the video transcoding card 1 is, for example, in a double-width or dual-width size. In other words, the width of the video transcoding card 1 is approximately two times of the width of a single-width transcoding cards. The video transcoding card 1 includes a first transcoding assembly 10 and a second transcoding assembly 20.

Figure 3:
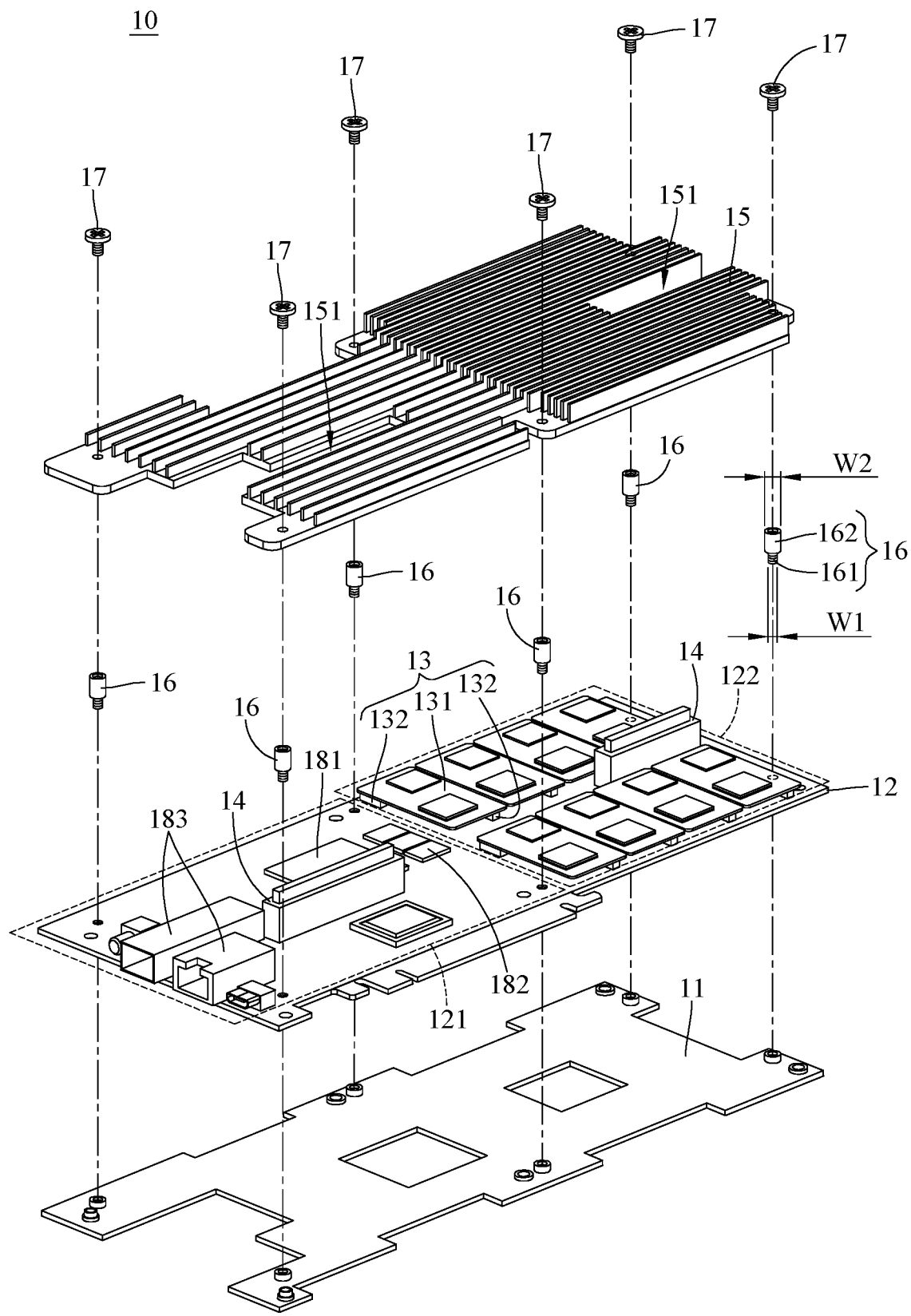
FIG. 3 is an exploded view of a first transcoding assembly of the video transcoding card in FIG. 2.

Referring to FIGS. 2 and 3, FIG. 3 is an exploded view of a first transcoding assembly 10 of the video transcoding card 1 in FIG. 2.

The first transcoding assembly 10 includes a first back plate 11, a first circuit board 12, a plurality of first transcoding boards 13, two first main electrical connectors 14, a first heat dissipation component 15, a plurality of studs 16, and a plurality of screws 17.

The first circuit board 12 is stacked on the first back plate 11. The quantity of the first transcoding boards 13 is, for example, 8. The first transcoding boards are the same in structure, and thus the following description will only introduce one of them in detail. The first transcoding board 13 is made by any-layer process and has a thickness of approximately 0.7 millimeters. The first transcoding board 13 includes a circuit board 131 and two first electrical connectors 132. There are multiple electronic components (not shown), such as processing unit, random access memory, universal flash storage, on the circuit board 131. The first electrical connectors 132 are disposed on the same surface of the circuit board 131, and sides of the first electrical connectors 132 located away from the circuit board 131 are disposed on the first circuit board 12, such that the circuit board 131 is spaced apart from the first circuit board 12 via the two first electrical connectors 132, and the circuit board 131 is electrically connected to the first circuit board 12 via the two first electrical connectors 132.

In this embodiment, since the circuit board 131 and the first circuit board 12 are space apart from each other, wiring can be easily arranged on the first circuit board 12.

Note that the circuit board 131 is not restricted to be spaced apart from the first circuit board 12 in the invention; in some other embodiments, the first transcoding board may not include any electrical connector, and the circuit board may be directly disposed on the first circuit board so as to be electrically connected to the first circuit board. In such a configuration, wiring may be arranged to dodge away from the circuit board.

The first main electrical connectors 14 and the first electrical connectors 132 are disposed on the same surface of the first circuit board 12, and the first main electrical connectors 14 are electrically connected to the first circuit board 12. The first circuit board 12 is located between the first back plate 11 and the first transcoding boards 13 and between the first back plate 11 and the first main electrical connectors 14.

The studs 16 are the same in structure. Each of the stud 16 includes a narrow portion 161 and a wide portion 162 connected to each other. In one of the studs 16, the width W2 of the wide portion 162 is larger than the width W1 of the narrow portion 161. The narrow portions 161 are disposed through the first circuit board 12 and screwed into the first back plate 11, such that the first circuit board 12 is located between and clamped by the wide portions 162 of the studs 16 and the first back plate 11. The screws 17 are disposed through the first heat dissipation component 15 and respectively screwed into the wide portions 162 of the studs 16, such that the first heat dissipation component 15 is fixed to the first back plate 11 via the studs 16 and the screws 17. The first heat dissipation component 15 is, for example, a heat dissipation fin assembly. The first heat dissipation component 15 is stacked on and in thermal contact with sides of the circuit boards 131 of the first transcoding boards 13 located away from the first circuit board 12. The first heat dissipation component 15 can absorb heat generated by the first transcoding boards 13 and perform heat exchange with outside environment. The first heat dissipation component 15 has two through holes 151. The first main electrical connectors 14 are respectively disposed through the through holes 151.

Note that the first heat dissipation component 15 is optional in the invention and may be omitted, and therefore the stud and the screw used to fix the first heat dissipation component may be omitted.

In this embodiment, the video transcoding card 1 further includes a side plate 30. The side plate 30 has four mount portions 31 and 32, where the mount portions 31 are located between and clamped by the first back plate 11 and the first circuit board 12, and the mount portions 31 are fixed to the first back plate 11 and the first circuit board 12 via screwing.

Note that the quantity of the mount portions 31 are not intended to limit the invention and may be modified; in some other embodiments, the side plate 30 may have only one mount portion 31.

In this embodiment, the first circuit board 12 has a first area 121 and a second area 122. The first area 121 is located closer to the side plate 30 than the second area 122. The first transcoding assembly 10 further includes a processing chip 181, a memory 182, and a plurality of connection ports 183. The processing chip 181, the memory 182, and the connection ports 183 and one of the first main electrical connectors 14 are located at the first area 121, and the other one of the first main electrical connectors 14 and the first transcoding boards 13 are located at the second area 122. The processing chip 181, the memory 182, and the connection ports 183 are electrically connected to the first circuit board 12.

In this embodiment, the positions of the processing chip 181, the memory 182, the connection ports 183, the first main electrical connector 14, and the first transcoding board 13 are not intended to limit the invention and may be modified according to an actual requirement.

Figure 4:
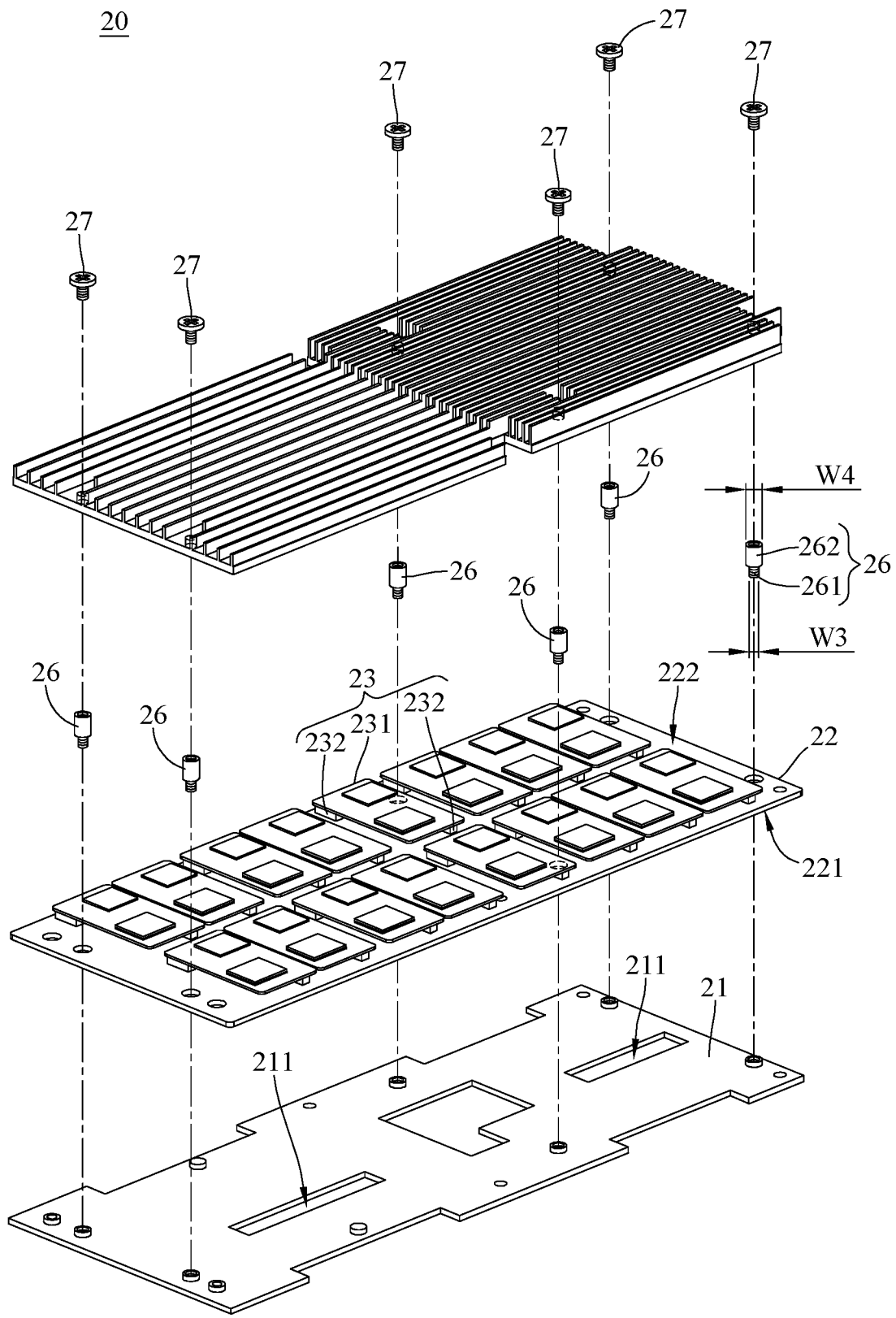
FIG. 4 is an exploded view of a second transcoding assembly of the video transcoding card in FIG. 2.
Figure 5:
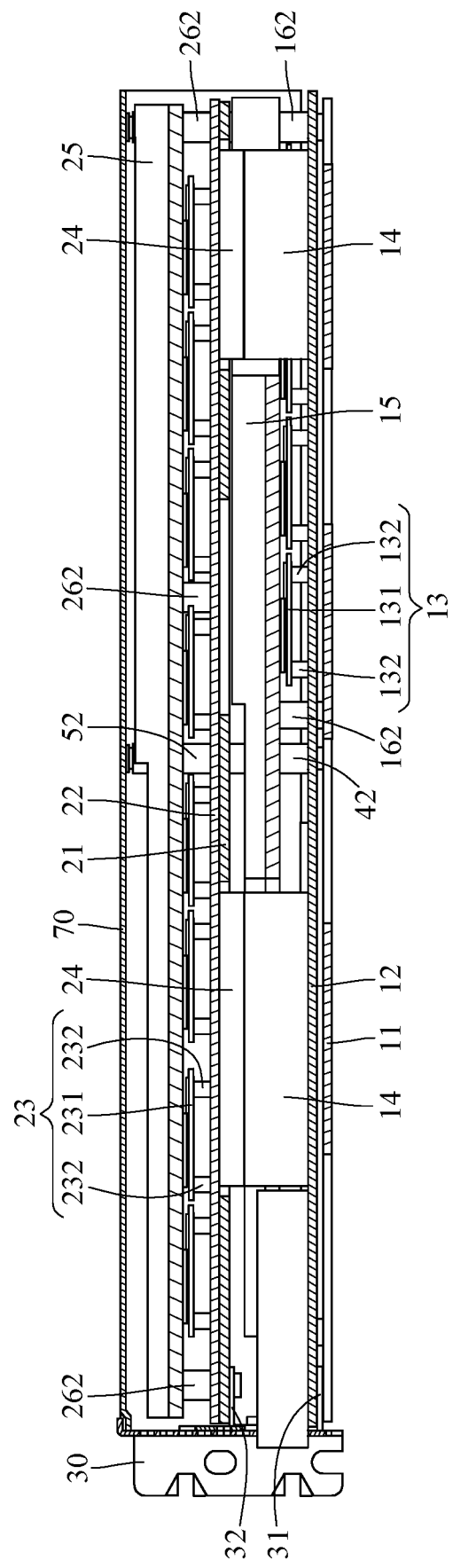
FIG. 5 is a cross-sectional view of the video transcoding card in FIG. 1.

Then, referring to FIGS. 2, 4 and 5, FIG. 4 is an exploded view of the second transcoding assembly 20 of the video transcoding card 1 in FIG. 2, and FIG. 5 is a cross-sectional view of the video transcoding card 1 in FIG. 1.

The second transcoding assembly 20 includes a second back plate 21, a second circuit board 22, a plurality of second transcoding boards 23, two second main electrical connectors 24, a second heat dissipation component 25, a plurality of studs 26, and a plurality of screws 27.

The second circuit board 22 has a first surface 221 and a second surface 222 opposite to each other. The first surface 221 of the second circuit board 22 is stacked on the second back plate 21. The second back plate 21 and the second circuit board 22 are fixed to the mount portions 32 of the side plate 30 via screwing.

Note that the quantity of the mount portions 32 is not intended to limit the invention and may be modified; in some other embodiments, the side plate 30 may have only one mount portion 32.

The quantity of the second transcoding boards 23 is, for example, 16. The second transcoding boards 23 are substantially arranged on the entire second surface 222 of the second circuit board 22. The second transcoding boards 23 are the same in structure, and thus the following description only introduce one of them in detail. The second transcoding board 23 is made by any-layer process and has a thickness of approximately 0.7 millimeters. The second transcoding board 23 includes a circuit board 231 and two second electrical connectors 232. There are multiple electronic components (not shown), such as processing unit, random access memory, and universal flash storage, on the circuit board 231. The two second electrical connectors 232 are disposed on the same surface of the circuit board 231, and sides of the two second electrical connector 232 located away from the circuit board 231 are disposed on the second surface 222 of the second circuit board 22, such that the second circuit board 22 is located between the second back plate 21 and the second transcoding board 23, the circuit board 231 is spaced apart from the second circuit board 22 via the two second electrical connectors 232, and the circuit board 231 is electrically connected to the second circuit board 22 via the two second electrical connectors 232.

In this embodiment, since the circuit board 231 and the second circuit board 22 are space apart from each other, wiring can be easily arranged on the second circuit board 22.

Note that the circuit board 231 is not restricted to be spaced apart from the second circuit board 22 in the invention; in some other embodiments, the second transcoding board may not include any electrical connector, and the circuit board may be directly disposed on the second circuit board so as to be electrically connected to the second circuit board. In such a configuration, the circuits may be arranged to dodge away from the circuit board.

In this embodiment, the second back plate 21 has two through holes 211. The second main electrical connectors 24 are disposed on the first surface 221 of the second circuit board 22 and respectively disposed through the through holes 211 of the second back plate 21, and the second main electrical connectors 24 are electrically connected to the second circuit board 22.

The studs 26 are the same in structure. Each of the stud 26 includes a narrow portion 261 and a wide portion 262 connected to each other. In one of the studs 26, the width W4 of the wide portion 262 is larger than the width W3 of the narrow portion 261. The narrow portions 261 are disposed through the second circuit board 22 and screwed into the second back plate 21, such that the second circuit board 22 is located between and clamped by the wide portions 262 of the studs 26 and the second back plate 21. The screws 27 are disposed through the second heat dissipation component 25 and respectively screwed into the wide portions 262 of the studs 26, such that the second heat dissipation component 25 is fixed to the second back plate 21 via the studs 26 and the screws 27. The second heat dissipation component 25 is, for example, a heat dissipation fin assembly. The second heat dissipation component 25 is stacked on and in thermal contact with sides of the circuit boards 231 of the second transcoding boards 23 located away from the second circuit board 22. The second heat dissipation component 25 can absorb heat generated by the second transcoding boards 23 and perform heat exchange with outside environment.

Note that the second heat dissipation component 25 is optional in the invention and may be omitted, and therefore the stud and the screw used to fix the second heat dissipation component may be omitted.

In this embodiment, the video transcoding card 1 further includes a plurality of first studs 40, a plurality of second studs 50, a plurality of first screws 60, and a cover 70.

The first studs 40 are the same in structure. Each of the first stud 40 includes a narrow portion 41 and a wide portion 42 connected to each other. In one of the first studs 40, the width W6 of the wide portion 42 is larger than the width W5 of the narrow portion 41. The narrow portions 41 are disposed through the first circuit board 12 and screwed into the first back plate 11, and the first circuit board 12 is located between and clamped by the first back plate 11 and the wide portions 42 of the first studs 40. Ends of the wide portions 42 of the first studs 40 located away from the first back plate 11 support a side of the second back plate 21 located away from the second circuit board 22.

The second studs 50 are the same in structure. Each of the second stud 50 includes a narrow portion 51 and a wide portion 52 connected to each other. In one of the second studs 50, the width W8 of the wide portion 52 is larger than the width W7 of the narrow portion 51. The narrow portions 51 of the second studs 50 are disposed through the second circuit board 22 and the second back plate 21 and respectively screwed into the wide portions 42 of the first studs 40, such that the second back plate 21 and the second circuit board 22 are located between and clamped by the wide portions 42 of the first studs 40 and the wide portions 52 of the second studs 50. The second main electrical connectors 24 are respectively connected to the first main electrical connectors 14 so as to hold the second circuit board 22 to be located above the first circuit board 12, and the second transcoding boards 23 are electrically connected to the processing chip 181 via the second circuit board 22, the second main electrical connectors 24, the first main electrical connectors 14, and the first circuit board 12.

Four of the first screws 60 are disposed through the cover 70 and respectively screwed into ends of the wide portions 52 of the second studs 50 respectively located away from the first studs 40, another one of the first screws 60 is disposes through the side plate 30 and screwed into the cover 70, and the other one of the first screws 60 is sequentially disposed through the cover 70, the first circuit board 12, and the mount portion 31 of the side plate 30 and screwed into the first back plate 11, such that the cover 70, the side plate 30 and the first back plate 11 together cover the first circuit board 12, the first transcoding boards 13, the first main electrical connectors 14, the first studs 40, the second transcoding assembly 20, and the second studs 50.

In general, the circuit board of a single-width transcoding card is required to have an area for arranging electronic components, such as processing chip, memory, connection port, such that the space on the single-width transcoding card can merely accommodate eight transcoding boards at most. In this embodiment, the first transcoding boards 13 are disposed on the first circuit board 12, the second transcoding boards 23 are disposed on the second circuit board 22, and the second transcoding boards 23 on the second circuit board 22 are electrically connected to the processing chip 181 via the second circuit board 22, the second main electrical connectors 24, the first main electrical connectors 14, and the first circuit board 12. Thus the first circuit board 12 can serve as the main board of the video transcoding card 1; that is, the second transcoding boards 23 on the second circuit board 22 and the first transcoding boards 13 on the first circuit board 12 can share the electronic components (e.g., the processing chip 181, the memory 182, and the connection ports 183 on the) on the first circuit board 12. As such, the arrangement of the electronic components on the second circuit board 22 can be omitted, such that the space on the second circuit board 22 can accommodate the second transcoding boards 23 as many as possible to make the total amount (e.g., 24) of the transcoding boards of the video transcoding card 1 greater than the total amount (e.g., 16) of the transcoding boards of two single-width transcoding card. Therefore, assuming that the video transcoding card 1 and the two single-width transcoding card substantially occupy the same size of the space in a server, adopting the video transcoding card 1 can increase the performance of the video transcoding.

In this embodiment, the first back plate 11 and the second back plate 21 can respectively increase the structural strengths of the first transcoding assembly 10 and the second transcoding assembly 20. Note that the first back plate and the second back plate are optional in the invention; in some other embodiments, both of the first transcoding assembly and the second transcoding assembly may not have any back plate.

In addition, the first studs 40 are also optional in the invention; in some other embodiments, the video transcoding card may not have any first stud. In such a configuration, the second circuit board may be supported above the first circuit board merely via the first main electrical connectors and the second main electrical connectors.

Moreover, the quantities of the first main electrical connectors 14 and the second main electrical connectors 24 are not intended to limit the invention and may be modified; in some other embodiments, the first transcoding assembly and the second transcoding assembly may each have only one main electrical connector.

Furthermore, the cover 70 is optional in the invention; in some other embodiments, the video transcoding card may not include the cover. In such a configuration, the second studs and the first screws used to fix the cover may be omitted.

Also, the side plate 30 is also optional in the invention; in some other embodiments, the video transcoding card may not include the side plate.

Note that the quantities of the first transcoding boards 13 and the second transcoding boards 23 are not intended to limit the invention and may be modified according to an actual requirement.

According to the video transcoding card discussed in the above embodiment, there are many first transcoding boards disposed on the first circuit board and many second transcoding boards disposed on the second circuit board, and the second transcoding boards on the second circuit board are electrically connected to the first circuit board via the second circuit board, the second main electrical connectors, and the first main electrical connectors. Thus, the first circuit board can serve as the main board of the video transcoding card; that is, the second transcoding boards on the second circuit board and the first transcoding boards on the first circuit board can share the electronic components on the first circuit board. As such, the arrangement of the electronic components on the second circuit board can be omitted, such that the space on the second circuit board can accommodate the second transcoding boards as many as possible to make the total amount of the transcoding boards of the video transcoding card greater than the total amount of the transcoding boards of two single-width transcoding cards. Therefore, assuming that the video transcoding card and the two single-width transcoding cards substantially occupy the same size of the space in a server, adopting the video transcoding card can increase the performance of the video transcoding.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A video transcoding card, comprising:
   a first transcoding assembly, comprising a first circuit board, a plurality of first transcoding boards, and at least one first main electrical connector, wherein the plurality of first transcoding boards and the at least one first main electrical connector are disposed on the first circuit board and are electrically connected to the first circuit board; and
   a second transcoding assembly, comprising a second circuit board, a plurality of second transcoding boards and at least one second main electrical connector, wherein the plurality of second transcoding boards and the at least one second main electrical connector are disposed on the second circuit board and are electrically connected to the second circuit board, the at least one first main electrical connector and the at least one second main electrical connector are connected to each other so as to hold the second circuit board to be located above the first circuit board, and the plurality of second transcoding boards are electrically connected to the first circuit board via the second circuit board, the at least one second main electrical connector, and the at least one first main electrical connector;
   wherein the video transcoding card further comprises a plurality of first studs, the first transcoding assembly further comprises a first back plate, the second transcoding assembly further comprises a second back plate, the first circuit board is stacked on the first back plate, the first circuit board is located between the first back plate and the plurality of first transcoding boards, the first circuit board is located between the first back plate and the at least one first main electrical connector, the second circuit board is stacked on the second back plate and located between the second back plate and the plurality of second transcoding boards, the plurality of first studs are disposed through the first circuit board and screwed into the first back plate, and ends of the plurality of first studs located away from the first back plate support the second back plate.

2. The video transcoding card according to claim 1, further comprising a plurality of second studs, a plurality of first screws, and a cover, wherein the plurality of the second studs are disposed through the second back plate and the second circuit board and are respectively screwed into the plurality of first studs, the plurality of first screws are disposed through the cover and are respectively screwed into ends of the plurality of second studs located away from the plurality of first studs so that the cover and the first back plate together cover the first circuit board, the plurality of first transcoding boards, the at least one first main electrical connector, the plurality of first studs, the second transcoding assembly, and the plurality of second studs.

3. The video transcoding card according to claim 1, wherein the first transcoding assembly further comprises a first heat dissipation component, the first heat dissipation component is stacked on and in thermal contact with sides of the plurality of first transcoding boards located away from the first circuit board, the second transcoding assembly further comprises a second heat dissipation component, and the second heat dissipation component is stacked on and in thermal contact with sides of the plurality of second transcoding boards located away from the second circuit board.

4. The video transcoding card according to claim 3, wherein the first transcoding assembly further comprises a plurality of studs and a plurality of screws, the plurality of studs of the first transcoding assembly are disposed through the first circuit board and screwed into the first back plate, the plurality of screws of the first transcoding assembly are disposed through the first heat dissipation component and respectively screwed into the plurality of studs of the first transcoding assembly, the second transcoding assembly further comprises a plurality of studs and a plurality of screws, the plurality of studs of the second transcoding assembly are disposed through the second circuit board and screwed into the second back plate, and the plurality of screws of the second transcoding assembly are disposed through the second heat dissipation component and respectively screwed into the plurality of studs of the second transcoding assembly.

5. The video transcoding card according to claim 1, further comprising a side plate, wherein the side plate has two mount portions, and the two mount portions are respectively fixed to the first back plate and the second back plate via screwing.

6. The video transcoding card according to claim 5, wherein the first transcoding assembly further comprises a processing chip, the first circuit board has a first area and a second area, the first area is located closer to the side plate than the second area, the processing chip is disposed on the first area and electrically connected to the first circuit board, the plurality of first transcoding boards are disposed on the second area, and the plurality of second transcoding boards are electrically connected to the processing chip via the second circuit board, the at least one second main electrical connector, the at least one first main electrical connector, and the first circuit board.

7. The video transcoding card according to claim 6, wherein the plurality of first transcoding boards comprises eight first transcoding boards, and the plurality of second transcoding boards comprises sixteen second transcoding boards.

8. The video transcoding card according to claim 1, wherein each of the plurality of first transcoding boards comprises a circuit board and two first electrical connectors, and each of the plurality of second transcoding boards comprises a circuit board and two second electrical connectors;
in each of the plurality of first transcoding boards, the circuit board is electrically connected to the first circuit board via the two first electrical connectors; and
in each of the plurality of second transcoding boards, the circuit board is electrically connected to the second circuit board via the two second electrical connectors.

9. The video transcoding card according to claim 8, wherein in each of the plurality of first transcoding boards, the circuit board is spaced apart from the first circuit board by the two first electrical connectors; in each of the plurality of second transcoding boards, the circuit board is spaced apart from the second circuit board by the two second electrical connectors.

* * * * *